(12) United States Patent
Zhang et al.

(10) Patent No.: US 9,293,509 B2
(45) Date of Patent: *Mar. 22, 2016

(54) SMALL-GRAIN THREE-DIMENSIONAL MEMORY

(71) Applicant: HangZhou HaiCun Information Technology Co. Ltd., HangZhou (CN)

(72) Inventors: Guobiao Zhang, Corvallis, OR (US); Bin Yu, HangZhou (CN); HongYu Yu, ShenZhen (CN); Jin He, Beijing (CN); JinFeng Kang, Beijing (CN); ZhiWei Liu, ChengDu (CN)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/614,434

(22) Filed: Feb. 5, 2015

(65) Prior Publication Data

US 2015/0214277 A1 Jul. 30, 2015

Related U.S. Application Data

(63) Continuation-in-part of application No. 13/848,018, filed on Mar. 20, 2013, now Pat. No. 9,001,555.

(51) Int. Cl.
| | |
|---|---|
| *H01L 27/24* | (2006.01) |
| *G11C 5/02* | (2006.01) |
| *G11C 11/56* | (2006.01) |
| *G11C 13/00* | (2006.01) |
| *G11C 17/10* | (2006.01) |
| *G11C 17/16* | (2006.01) |
| *H01L 45/00* | (2006.01) |
| *H01L 27/102* | (2006.01) |

(52) U.S. Cl.
CPC .............. *H01L 27/2481* (2013.01); *G11C 5/02* (2013.01); *G11C 11/5692* (2013.01); *G11C 13/0004* (2013.01); *G11C 13/0007* (2013.01); *G11C 13/0011* (2013.01); *G11C 17/10* (2013.01); *G11C 17/16* (2013.01); *H01L 27/2436* (2013.01); *G11C 2213/71* (2013.01); *G11C 2213/73* (2013.01); *H01L 27/1021* (2013.01); *H01L 45/04* (2013.01); *H01L 45/06* (2013.01); *H01L 45/085* (2013.01); *H01L 45/141* (2013.01); *H01L 45/146* (2013.01)

(58) Field of Classification Search
USPC .............. 365/148, 94, 96, 100, 105, 163, 175
See application file for complete search history.

(56) References Cited

U.S. PATENT DOCUMENTS

| | | | |
|---|---|---|---|
| 4,404,655 | A | 9/1983 | Naiff |
| 4,424,579 | A | 1/1984 | Roesner |
| 4,598,386 | A | 7/1986 | Roesner et al. |
| 4,603,341 | A | 7/1986 | Bertin et al. |
| 4,646,266 | A | 2/1987 | Ovshinsky et al. |

(Continued)

*Primary Examiner* — Trong Phan

(57) ABSTRACT

The present invention discloses a small-grain three-dimensional memory (3D-MSG). Each of its memory cells comprises a thin-film diode with critical dimension no larger than 40 nm. The thin-film diode comprises at least a small-grain material, whose grain size G is substantially smaller than the diode size D. The small-grain material is preferably a nanocrystalline material or an amorphous material. The critical dimension f of the small-grain diode is smaller than the critical dimension F of the single-crystalline transistor.

20 Claims, 4 Drawing Sheets

(56) References Cited

U.S. PATENT DOCUMENTS

| | | |
|---|---|---|
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,624,485 B2 | 9/2003 | Johnson |
| 6,717,222 B2 | 4/2004 | Zhang |
| 6,903,427 B2 | 6/2005 | Zhang |
| 7,386,652 B2 | 6/2008 | Zhang |
| 7,423,304 B2 | 9/2008 | Cleeves et al. |
| 7,449,376 B2 | 11/2008 | Isobe et al. |
| 7,728,391 B2 | 6/2010 | Zhang |
| 2007/0252153 A1 | 11/2007 | Koyama |

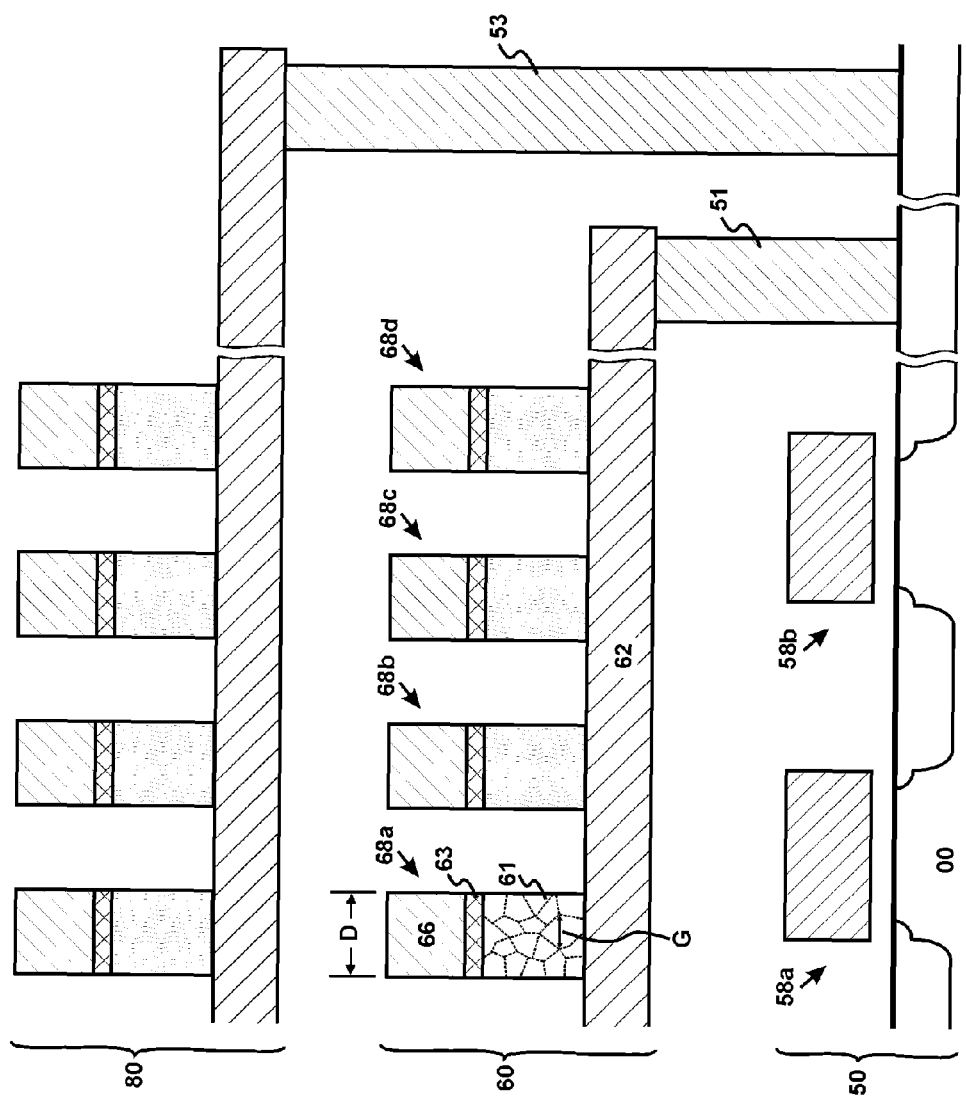

SMALL-GRAIN THREE-DIMENSIONAL MEMORY

CROSS-REFERENCE TO RELATED APPLICATIONS

This application is a continuation-in-part of "Small-Grain Three-Dimensional Memory", application Ser. No. 13/848,018, filed Mar. 20, 2013, U.S. Pat. No. 9,001,555, issued on Apr. 7, 2015, which claims foreign priority of a Chinese Patent Application Ser. No. 201210089545.5, "Small-Grain Three-Dimensional Memory", filed in People's Republic of China on Mar. 30, 2012.

BACKGROUND

1. Technical Field of the Invention

The present invention relates to the field of integrated circuit, and more particularly to diode-based monolithic three-dimensional semiconductor memory.

2. Prior Arts

Three-dimensional memory (3D-M) is a monolithic semiconductor memory. It comprises a plurality of vertically stacked memory levels. As illustrated in FIG. 1, a 3D-M comprises at least a substrate level 30 and a memory level 40. The substrate level 30 comprises a plurality of transistors (38a . . . ). Formed in a single-crystalline semiconductor substrate 00, these transistors are single-crystalline transistors. Each transistor further includes a gate 34 and a source/drain 32. The memory level 40 comprises a plurality of address lines (42, 46 . . . ) and memory cells (48a . . . ). Each memory cell 48a is located at the cross-point between two address lines 42, 46. It comprises a thin-film diode 41 and a storage layer 43. The thin-film diode 41 prevents cross-talks between memory cells, while the storage layer 43 determines the data stored in the memory cell 48a.

U.S. Pat. No. 7,386,652 issued to Zhang on Jun. 10, 2008, U.S. Pat. No. 7,423,304 issued to Cleeves et al on Sep. 9, 2008, and U.S. Pat. No. 7,728,391 issued to Zhang on Jun. 1, 2010 disclosed a small-pitch 3D-M (3D-$M_{SP}$). The 3D-M in FIG. 1 is a 3D-$M_{SP}$, where the minimum address-line pitch p of the memory level 40 (also referred to as the above-substrate pitch) is smaller than the minimum transistor-gate pitch P of the substrate level 30 (also referred to as the substrate pitch).

One factor that prior arts failed to notice is that the thin-film diode 41 in the 3D-M cell is a poly-crystalline diode which exhibits different electrical behavior than its single-crystalline counterpart. Here, a poly-crystalline diode is made of poly-crystalline material, e.g. poly-crystalline silicon (poly-Si). FIG. 1 further discloses a schematic drawing of the grain structure inside the thin-film diode 41 of the memory cell 48a. The dashed lines represent grain boundaries. When the 3D-$M_{SP}$ is scaled to the point where the size D of the thin-film diode 41 approaches the grain size G of poly-Si, more particularly when the critical dimension of the thin-film diode 41 is scaled to 40 nm or below, each thin-film diode 41 comprises just few crystalline grains: grains "a", "b", "c", "d", "e". As a result, the thin-film diode 41 (i.e. memory cells) will exhibit significant performance variation: even two thin-film diodes with the same design (i.e. with same layout and cross-section) could have vastly different I-V characteristics. This leads to unacceptable read/write error rate. Furthermore, a large current fluctuation becomes more troublesome when multi-bit-per-cell is employed to increase the storage density of a 3D-$M_{SP}$, because multi-bit-per-cell requires a tight current control.

In sum, the prior-art 3D-$M_{SP}$ has a poor performance and a limited storage density. To address these issues, the present invention discloses a small-grain 3D-M (3D-$M_{SG}$).

OBJECTS AND ADVANTAGES

It is a principle object of the present invention to improve the performance of the small-pitch 3D-M.

It is a further object of the present invention to increase the storage density of the small-pitch 3D-M.

It is a further object of the present invention to reduce the read/write error rate of the small-pitch 3D-M.

It is a further object of the present invention to improve the consistency of memory cells in a small-pitch 3D-M.

In accordance with these and other objects of the present invention, the present invention discloses a small-grain 3D-M (3D-$M_{SG}$). It makes further improvement to the small-pitch 3D-M (3D-$M_{SP}$).

SUMMARY OF THE INVENTION

In order to limit the performance variation of the thin-film diode in a 3D-M, the present invention discloses a small-grain 3D-M (3D-$M_{SG}$). The 3D-$M_{SG}$ is particularly suitable for the 3D-M whose critical dimension is scaled to 40 nm or below. Its thin-film diode is a small-grain diode. The small-grain diode comprises at least one small-grain material, whose grain size G is substantially smaller than the diode size D. One example of the small-grain material is nano-crystalline material. The nano-crystalline material has small grains of crystalline material within the amorphous phase. Its grain size G is preferably less than 10 nm. Because each small-grain diode comprises a large number of crystalline grains, the current fluctuation caused by each individual grain can be averaged out. As a result, the small-grain diode has a more consistent behavior (e.g. a small current fluctuation). This can significantly reduce the read/write error rate for the 3D-M. As an extreme example, the small-grain diode can use amorphous material to achieve a tight current control and enable multi-bit-per-cell for the 3D-M, more particularly for the 3-D mask-programmed read-only memory (3D-MPROM).

Compared with the single-crystalline transistor, the small-grain diode has a simpler structure. Accordingly, its scaling is easier than the transistor scaling. To be more specific, the scaling of the single-crystalline transistor involves many factors, e.g. lithography, gate material, gate dielectric material, channel doping, source/drain engineering and others. On the other hand, the scaling of the small-grain diode is much simpler: it is more or less limited by lithography and grain size. As a result, the critical dimension f of the memory level (or, the small-grain diodes) can be smaller than the critical dimension F of the substrate level (or, the single-crystalline transistors). More importantly, the critical dimension f of the memory level (or, the small-grain diodes) can be smaller than the critical dimension $F_f$ of the contemporary mass-produced flash memory.

BRIEF DESCRIPTION OF THE DRAWINGS

FIG. 2 is a cross-sectional view of a preferred small-grain 3D-M (3D-$M_{SG}$);

DETAILED DESCRIPTION OF THE PREFERRED EMBODIMENTS

Figure 1:
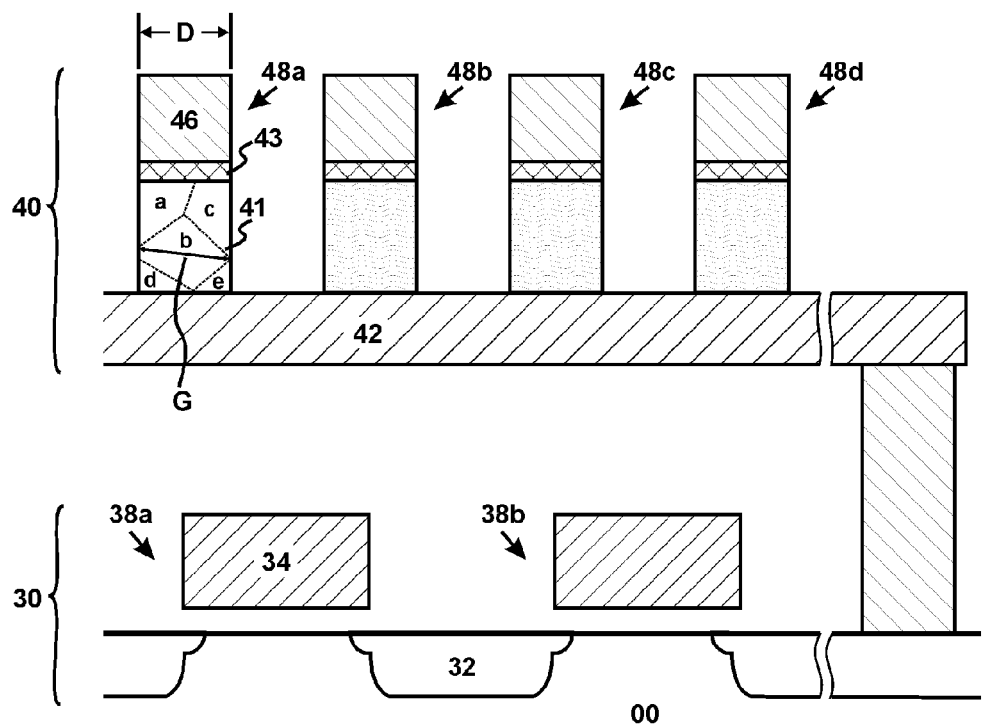
FIG. 1 is a cross-sectional view of a prior-art small-pitch 3D-M (3D-$M_{SP}$)

Those of ordinary skills in the art will realize that the following description of the present invention is illustrative only and is not intended to be in any way limiting. Other embodiments of the invention will readily suggest themselves to such skilled persons from an examination of the within disclosure.

Referring now to FIG. 2, a preferred small-grain 3D-M (3D-$M_{SG}$) is disclosed. It comprises a substrate level 50 and at least two memory levels 60, 80. The substrate level 50 comprises a plurality of functional transistors 58a, 58b. Formed in the substrate 00, these transistors are single-crystalline transistors. Here, "functional transistors", unlike "dummy transistors", perform certain chip functions. These functional transistors could form a peripheral circuit for the 3D-M, a processing circuit which processes the 3D-M data, and/or a memory circuit (e.g. a transistor-based memory, such as a RAM array or a ROM array) which functions as a buffer or redundancy for the 3D-M data. The transistor-gate pitch P is the center-to-center distance between the poly gates of adjacent transistors 58a, 58b. The minimum transistor-gate pitch P is twice the critical dimension F of the substrate level 50. In general, the critical dimension F of the substrate level 50 is also the critical dimension of the single-crystalline transistors.

The memory levels 60, 80 are stacked above the substrate level 50. They are coupled to the substrate level 50 through inter-level vias 51, 53. Each memory level 60 comprises a plurality of address lines (62, 66 . . . ) and memory cells (68a . . . ). Each memory cell 68a is located at the cross-point between two address lines (62, 66). It comprises a thin-film diode 61 and a storage layer 63. In the present invention, diode (also known as quasi-conduction layer in the U.S. Pat. No. 5,835,396) is not limited to the diode in the traditional sense, but can be broadly interpreted as any two-terminal device whose current is much larger at the read voltage than when the applied voltage has a magnitude smaller than or polarity opposite to that of the read voltage. The thin-film diode 61 could take many forms. For example, it could be layers of oppositely-doped semiconductor material (e.g. Si, Ge, C), or a thin layer of dielectric material (e.g. metal oxide, or lightly-doped or un-doped amorphous semiconductor material). In the memory level 60, the line pitch p is the center-to-center distance between adjacent address lines (e.g. 68c, 68d) in the memory array. The minimum line pitch p is twice the critical dimension f of the memory level 60. In general, the critical dimension f of the memory level 60 is also the critical dimension of the small-grain diodes. Similarly, in the memory level 80, the line pitch p* is the center-to-center distance between adjacent address lines (e.g. 88c, 88d) in the memory array. The minimum line pitch p* is twice the critical dimension f* of the memory level 80. In general, the critical dimension f* of the memory level 80 is also the critical dimension of the small-grain diodes.

FIG. 2 also discloses a schematic drawing of the grain structure inside the thin-film diode 61 of the memory cell 68a. The dashed lines represent grain boundaries. The thin-film diode 61 is a small-grain diode. The small-grain diode comprises at least one small-grain material, whose grain size G is substantially smaller than the diode size D. Here, the grain size G is the largest grain dimension along all possible directions, and the diode size D is the smallest diode dimension along all possible directions (e.g. the smallest of its width, length and thickness). Because a small-grain diode 61 comprises a large number of crystalline grains, the current fluctuation caused by each individual grain can be averaged out. As a result, the small-grain diode has a more consistent behavior (e.g. a small current fluctuation). This can significantly reduce the read/write error rate for the 3D-M. The 3D-$M_{SG}$ is particularly suitable for the 3D-M whose critical dimension f is scaled to 40 nm or below.

Because the critical dimension of the 3D-M is tens of nanometers (e.g. 40 nm), the small-grain material in the small-grain diode 61 is preferably a nano-crystalline material. A nano-crystalline material has small grains of crystalline material within the amorphous phase. Its grain size G is preferably less than 10 nm. Examples of nano-crystalline material include nano-crystalline silicon (nano-Si), nano-crystalline germanium (nano-Ge), nano-crystalline carbon (nano-C) and others. The nano-crystalline material (e.g. nano-Si) can be deposited using conventional low-temperature amorphous-silicon (a-Si) deposition techniques, such as PECVD.

Compared with the single-crystalline transistor, the small-grain diode has a simpler structure. Accordingly, its scaling is easier than transistor. To be more specific, the scaling of the single-crystalline transistor involves many factors, e.g. lithography, gate material, gate dielectric material, channel doping, source/drain engineering and others. On the other hand, the scaling of the small-grain diode is much simpler: it is more or less limited by lithography and grain size. According, the small-grain diode and the single-crystalline transistor following different scaling rules:

1) the critical dimension f of the small-grain diode could be smaller than the critical dimension F of the single-crystalline transistor. For example, when transistor uses F=40 nm technology, diode may use f=30 nm technology. In other words, the critical dimension f, f* of the memory levels 60, 80 can be smaller than the critical dimension F of the substrate level 50;

2) the small-grain diode can be scaled at a much faster rate than the single-crystalline transistor. For example, it will take three years to scale down one transistor generation, while it may take only two years for diode. This means the critical-dimension gap between diode and transistor will grow wider with time.

In a 3D-M, because transistors (58a, 58b . . . ) are located at a different level than the diodes (68a, 68b . . . ), they are manufactured independently and can use different technologies. Its substrate level 50 can be formed by a less expensive F technology (e.g. 40 nm), not by the more expensive f technology (e.g. 30 nm), which is used to form the memory levels 60, 80. This can lower the manufacturing cost of the substrate level 50.

More importantly, the critical dimension f of the memory level 60 can be smaller than the critical dimension $F_f$ of the contemporary mass-produced flash memory. Here, the contemporary mass-produced flash memory is the most advanced flash memory in commercial mass production at the same time as the 3D-$M_{SG}$; and its critical dimension $F_f$ is the critical dimension of its floating-gate transistor. For example, when the mass-produced flash memory uses $F_f$=40 nm technology, the 3D-$M_{SG}$ could use f<40 nm (e.g. ~30 nm) technology. Although the flash memory is the current leader of semiconductor storage, the 3D-$M_{SG}$ will replace it in the near future.

Figure 3A:
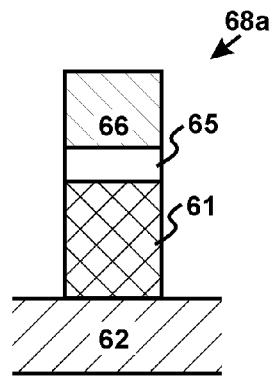
FIG. 3A and FIG. 3B illustrate two states of a preferred mask-programmed 3D-M (3D-MPROM) cell.
Figure 3B:
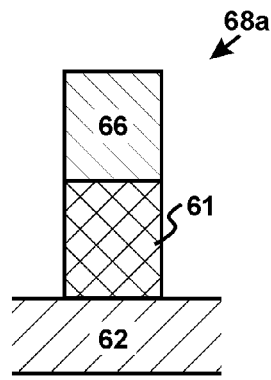
Figure 4:
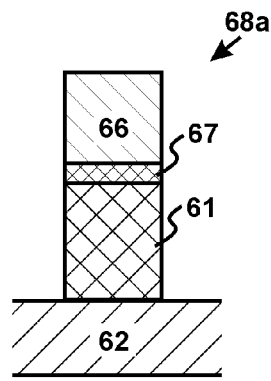
FIG. 4 illustrates a preferred one-time-programmable 3D-M (3D-OTP) cell.
Figure 5:
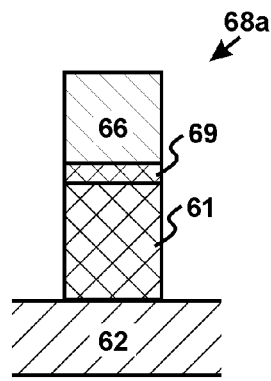
FIG. 5 illustrates a preferred re-writable 3D-M (3D-RWM) cell.

FIGS. 3A-5 disclose several preferred 3D-$M_{SG}$ cells. Among them, FIG. 3A and FIG. 3B disclose two states of a preferred mask-programmed 3D-M (3D-MPROM) cell; FIG. 4 and FIG. 5 discloses two preferred electrically-programmable 3D-M (3D-EPM) cells.

Referring now to FIGS. 3A and 3B, these figures disclose two states "0" and "1" of a preferred 3D-MPROM cell 68a. Its storage layer 63 is an insulating dielectric 65, whose existence indicates state "0" (FIG. 3A) and absence indicates state "1" (FIG. 3B). More details of the 3D-MPROM can be found in U.S. Pat. No. 5,835,396 issued to Zhang on Nov. 10, 1998.

Referring now to FIG. 4, a preferred 3D-EPM cell 68a is disclosed. This preferred 3D-EPM cell 68a is a one-time-programmable 3D-M (3D-OTP). Its storage layer 63 is an antifuse layer 67, whose breakdown indicates state change. More details of the 3D-OTP can be found in U.S. Pat. No. 5,835,396 issued to Zhang on Nov. 10, 1998 and U.S. Pat. No. 6,034,882 issued to Johnson et al on Mar. 7, 2000.

Referring now to FIG. 5, another preferred 3D-EPM cell 68a is disclosed. This preferred 3D-EPM cell 68a is a re-writable 3D-M (3D-RWM). It could be a resistive random access memory (ReRAM), phase-change memory (PCM), programmable metallization cell (PMC) or others. Its storage layer 63 is a re-writable layer 69, whose state change can be reversed. The re-writable layer 69 could comprise metal oxide (e.g. titanium oxide, nickel oxide), chalcogenide glass, electrolyte, or others. More details of the 3D-RWM can be found in U.S. Pat. No. 7,847,330 issued to Rinerson et al on Dec. 7, 2010.

In the present invention, amorphous is considered as an extreme phase of nano-crystalline: when the grain size becomes negligibly small, nano-crystalline becomes amorphous. Even in a nanometer-sized diode, amorphous material exhibits great uniformity. Amorphous diode, which comprises amorphous material, can achieve a tight current control. Although its current drive is small, amorphous diode is suitable for the applications that do not require a large current drive but requires a tight current control. One potential candidate is 3D-MPROM.

A 3D-MPROM does not require electrical programming. The only current flowing through its memory cells is read current, which is a small current and generally is much smaller than programming current. Accordingly, amorphous diode is suitable for the 3D-MPROM. Furthermore, because it can achieve a tight current control, amorphous diode can enable multi-bit-per-cell for the 3D-MPROM.

Figure 6:
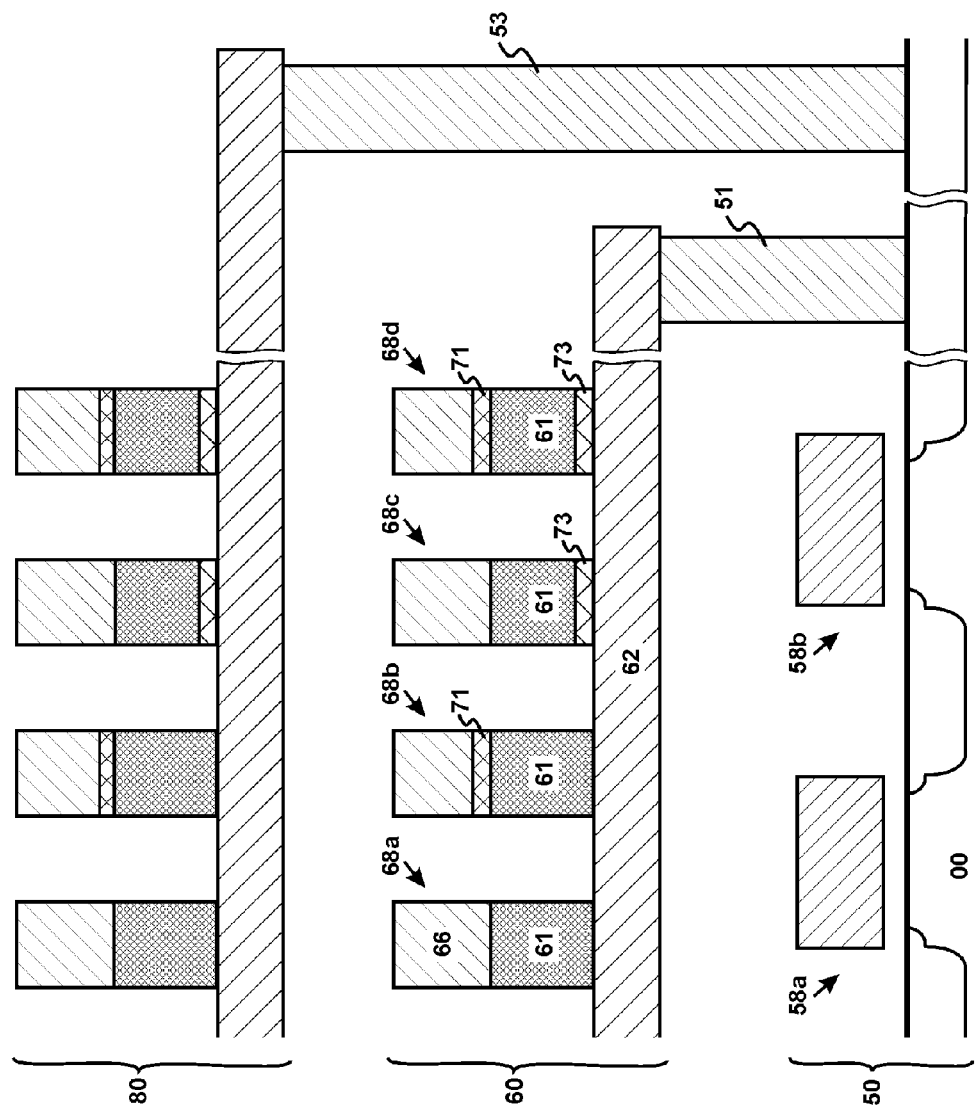
FIG. 6 is a cross-sectional view of a preferred amorphous 3D-MPROM with multi-bit-per-cell.

FIG. 6 discloses a preferred amorphous 3D-MPROM with multi-bit-per-cell. Similar to FIG. 2, the critical dimension f, f* of the memory levels 60, 80 is smaller than the critical dimension F of the substrate level 50. Each memory cell comprises an amorphous diode 61. The critical dimension of the amorphous diode 61 is preferably no larger than 40 nm. The amorphous diode 61 comprises at least one amorphous material. For example, it is a p-i-n diode, with the p, i, and n layers comprise amorphous silicon with varying doping type and concentration. This preferred embodiment stores 2 bits-per-cell. The memory cells 68a-68d in the memory level 60 store "0", "1", "2", "3", respectively. Among these memory cells, the memory cell 68a comprises the amorphous diode 61 only; the memory cell 68b comprises an additional first resistive layer 71, which is located on top of the diode 61 and alters the cell I-V characteristics to a first degree; the memory cell 68c comprises an additional second resistive layer 73, which is located at the bottom of the diode 61 and alters the cell I-V characteristics to a second degree; the memory cell 68d comprises both the first and second resistive layers 71, 73, which alters the cell I-V characteristics to a third degree. The resistive layers 71, 73 could comprise a thin layer of dielectric material (e.g. silicon oxide, silicon nitride, or amorphous silicon) and can alter the cell I-V characteristics. More details on 3D-MPROM with multi-bit-per-cell can be found in U.S. patent application Ser. No. 12/785,621, filed by Zhang on May 24, 2010.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A small-grain three-dimensional memory, comprising:
    a substrate level comprising a semiconductor substrate, said substrate level further comprising a plurality of functional transistors, said functional transistors forming at least a processing circuit; and
    at least a first memory level stacked above said semiconductor substrate and coupled to said substrate level through a plurality of inter-level vias, said first memory level comprising a plurality of memory cells, wherein each of said memory cells comprises a small-grain diode with a critical dimension no larger than 40 nm, a grain size of said small-grain diode being substantially smaller than a small-grain diode size;
    wherein the critical dimension of said first memory level is smaller than the critical dimension of said substrate level.

2. The small-grain three-dimensional memory according to claim 1, wherein said small-grain diode comprises at least one nano-crystalline material.

3. The small-grain three-dimensional memory according to claim 2, wherein the grain size of said nano-crystalline material is less than 10 nm.

4. The small-grain three-dimensional memory according to claim 1, wherein said small-grain diode comprises at least an amorphous material.

5. The small-grain three-dimensional memory according to claim 1, wherein said first memory level comprises a plurality of mask-programmed read-only memory cells.

6. The small-grain three-dimensional memory according to claim 1, wherein said first memory level comprises a plurality of electrically-programmable memory cells.

7. The small-grain three-dimensional memory according to claim 6, wherein said electrically-programmable memory cells are one-time-programmable (OTP) cells.

8. The small-grain three-dimensional memory according to claim 6, wherein said electrically-programmable memory cells are re-writable cells.

9. The small-grain three-dimensional memory according to claim 8, wherein said re-writable cells are resistive RAM (ReRAM) cells, phase-change memory (PCM) cells and/or programmable metallization cells (PMC).

10. The small-grain three-dimensional memory according to claim 1, further comprising a second memory level stacked above said first memory level, wherein the critical dimension of said second memory level is smaller than the critical dimension of said substrate level.

11. A small-grain three-dimensional memory, comprising:
    a substrate level comprising a semiconductor substrate, said substrate level further comprising a plurality of functional transistors, said functional transistors forming at least a memory circuit; and
    at least a first memory level stacked above said semiconductor substrate and coupled to said substrate level through a plurality of inter-level vias, said first memory level comprising a plurality of memory cells, wherein each of said memory cells comprises a small-grain diode with a critical dimension no larger than 40 nm, a grain size of said small-grain diode being substantially smaller than a small-grain diode size;

wherein the critical dimension of said first memory level is smaller than the critical dimension of said substrate level.

12. The small-grain three-dimensional memory according to claim 11, wherein said small-grain diode comprises at least one nano-crystalline material.

13. The small-grain three-dimensional memory according to claim 12, wherein the grain size of said nano-crystalline material is less than 10 nm.

14. The small-grain three-dimensional memory according to claim 11, wherein said small-grain diode comprises at least an amorphous material.

15. The small-grain three-dimensional memory according to claim 11, wherein said first memory level comprises a plurality of mask-programmed read-only memory cells.

16. The small-grain three-dimensional memory according to claim 11, wherein said first memory level comprises a plurality of electrically-programmable memory cells.

17. The small-grain three-dimensional memory according to claim 16, wherein said electrically-programmable memory cells are one-time-programmable (OTP) cells.

18. The small-grain three-dimensional memory according to claim 16, wherein said electrically-programmable memory cells are re-writable cells.

19. The small-grain three-dimensional memory according to claim 18, wherein said re-writable cells are resistive RAM (ReRAM) cells, phase-change memory (PCM) cells and/or programmable metallization cells (PMC).

20. The small-grain three-dimensional memory according to claim 11, further comprising a second memory level stacked above said first memory level, wherein the critical dimension of said second memory level is smaller than the critical dimension of said substrate level.

* * * * *